United States Patent
Hiramoto et al.

(10) Patent No.: US 11,782,827 B2
(45) Date of Patent: Oct. 10, 2023

(54) ELECTRONIC DEVICE, VEHICLE, AND CONTROL METHOD FOR CONTROLLING A NON-VOLATILE MEMORY BASED ON A DETECTED VOLTAGE DROP

(71) Applicant: KYOCERA Corporation, Kyoto (JP)

(72) Inventors: Toshikazu Hiramoto, Yokohama (JP); Kazuyuki Takaki, Kawasaki (JP)

(73) Assignee: KYOCERA Corporation, Kyoto (JP)

( * ) Notice: Subject to any disclaimer, the term of this patent is extended or adjusted under 35 U.S.C. 154(b) by 53 days.

(21) Appl. No.: 17/554,328

(22) Filed: Dec. 17, 2021

(65) Prior Publication Data
US 2022/0107889 A1  Apr. 7, 2022

Related U.S. Application Data

(63) Continuation of application No. PCT/JP2020/023708, filed on Jun. 17, 2020.

(30) Foreign Application Priority Data

Jun. 21, 2019 (JP) ................. 2019-115082

(51) Int. Cl.
*G06F 12/02* (2006.01)
*G06F 1/3225* (2019.01)

(52) U.S. Cl.
CPC ........ *G06F 12/0246* (2013.01); *G06F 1/3225* (2013.01)

(58) Field of Classification Search
CPC ............... G06F 12/0246; G06F 1/3225; G06F 2212/1032; G06F 2212/7202; G06F 1/30; G06F 11/00; G11C 5/143; G11C 16/30
See application file for complete search history.

(56) References Cited

U.S. PATENT DOCUMENTS

| | | |
|---|---|---|
| 6,667,928 B2 | 12/2003 | Honma et al. |
| 6,912,172 B2 | 6/2005 | Honma et al. |
| 2008/0309163 A1* | 12/2008 | Hashimoto ......... H02J 7/00308 361/86 |
| 2009/0030587 A1* | 1/2009 | Yonezawa ............... F02D 41/28 701/115 |
| 2009/0234531 A1* | 9/2009 | Sayama .................. H02J 9/061 701/31.7 |
| 2011/0133715 A1* | 6/2011 | Zushi ................. H03K 17/0822 323/285 |
| 2014/0223085 A1* | 8/2014 | Jo ........................ G11C 16/225 711/103 |
| 2014/0257632 A1* | 9/2014 | Kanzaki ................ B60R 16/033 701/36 |
| 2018/0349240 A1* | 12/2018 | Ji ........................ G06F 11/1441 |

FOREIGN PATENT DOCUMENTS

| | | |
|---|---|---|
| JP | 2002-099468 A | 4/2002 |
| JP | 2002-373495 A | 12/2002 |
| JP | 2003-002132 A | 1/2003 |
| JP | 2008-059007 A | 3/2008 |

* cited by examiner

*Primary Examiner* — Tasnima Matin
(74) *Attorney, Agent, or Firm* — Studebaker & Brackett PC

(57) ABSTRACT

An electronic device includes a NAND flash memory device, a memory controller that issues a command for performing either erasing or writing of data to the NAND flash memory device, and a voltage monitor that monitors a power supply and detects a voltage drop. When the voltage drop is detected before an issue of the command, the memory controller ceases the issue of the command to the NAND flash memory device.

8 Claims, 5 Drawing Sheets

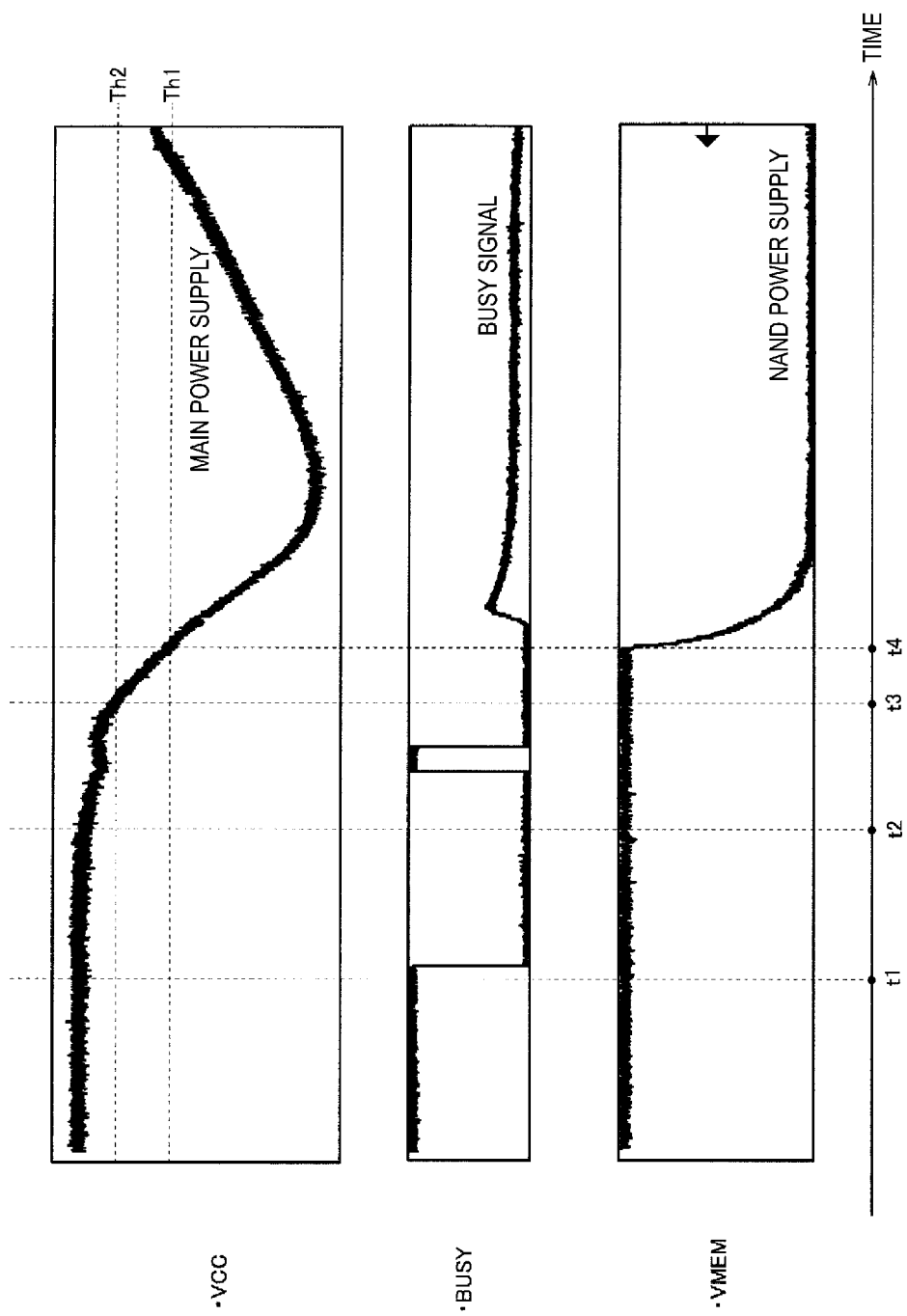

ELECTRONIC DEVICE, VEHICLE, AND CONTROL METHOD FOR CONTROLLING A NON-VOLATILE MEMORY BASED ON A DETECTED VOLTAGE DROP

RELATED APPLICATIONS

The present application is a continuation based on PCT Application No. PCT/JP2020/023708, filed on Jun. 17, 2020, which claims the benefit of Japanese Patent Application No. 2019-115082 filed on Jun. 21, 2019. The content of which is incorporated by reference herein in their entirety.

TECHNICAL FIELD

The present disclosure relates to an electronic device, a vehicle, and a control method.

BACKGROUND ART

An electronic device such as an in-vehicle communication module sometimes includes a non-volatile memory device, such as a NAND flash memory device. A processor provided in the electronic device controls the non-volatile memory device by issuing, to the non-volatile memory device, commands for writing, reading, and/or erasing, or the like of data.

In such electronic devices, writing or erasing of data fails when the power supply voltage drops due to power discontinuity during writing or erasing of data in the non-volatile memory device. In this case, a measure for preventing the stored data from being lost is commonly implemented by performing processing of writing back the data to a storage area that is a writing or erasing target executed through file system control or the like.

Known power discontinuity measures in an electronic device including a non-volatile memory device also include a technique of installing an internal battery for backup in the electronic device (see, for example, Patent Literature 1).

CITATION LIST

Patent Literature

Patent Literature 1: JP 2008-59007 A

SUMMARY

An electronic device according to a first aspect includes a non-volatile memory device, a memory controller that issues a command for either erasing or writing of data to the non-volatile memory device, and a voltage monitor that monitors a voltage of a power supply and detects a voltage drop. When the voltage drop is detected before an issue of the command, the memory controller ceases the issue of the command to the non-volatile memory device.

A vehicle according to a second aspect includes the electronic device according to the first aspect.

A method for controlling an electronic device including a non-volatile memory device according to a third aspect includes monitoring a voltage of a power supply and detecting a voltage drop; and when the voltage drop is detected before a command for performing either erasing or writing of data to the non-volatile memory device is issued, ceasing an issue of the command to the non-volatile memory device.

BRIEF DESCRIPTION OF DRAWINGS

FIG. 5 is a diagram illustrating an example of operation waveforms in the electronic device according to an embodiment.

DESCRIPTION OF EMBODIMENTS

As a result of diligent examination, the present inventors discovered that a drop in the power supply voltage during writing or erasing of data in the non-volatile memory device not only results in a loss of stored data in a storage area that is a writing or erasing target but may also result in a loss of stored data in a storage area other than the storage area that is the writing or erasing target.

In such a case, unfortunately, the data lost cannot be restored by write back processing through file system control or the like.

On the other hand, including internal battery for backup may prevent the loss of the stored data in a storage area other than the writing or erasing target storage area. However, this may lead to an increase in a product cost or a failure to deal with a sudden drop of power supply voltage due to contact failure of a connection connector or age deterioration of the battery.

In view of this, the present disclosure enables the prevention of the loss of stored data during the power supply voltage drop while suppressing an increase in product cost.

Embodiments will be described with reference to the drawings. In the description of the drawings, the same or similar parts are denoted by the same or similar reference signs.

Configuration of Electronic Device

First, a configuration of an electronic device according to an embodiment will be described. In an embodiment, an example where the electronic device is a communication module installed in a vehicle (that is, an in-vehicle communication module) will be mainly described. However, the electronic device is not limited to the in-vehicle communication module and may be any electronic device in which a power supply voltage drop may be generated.

Figure 1:
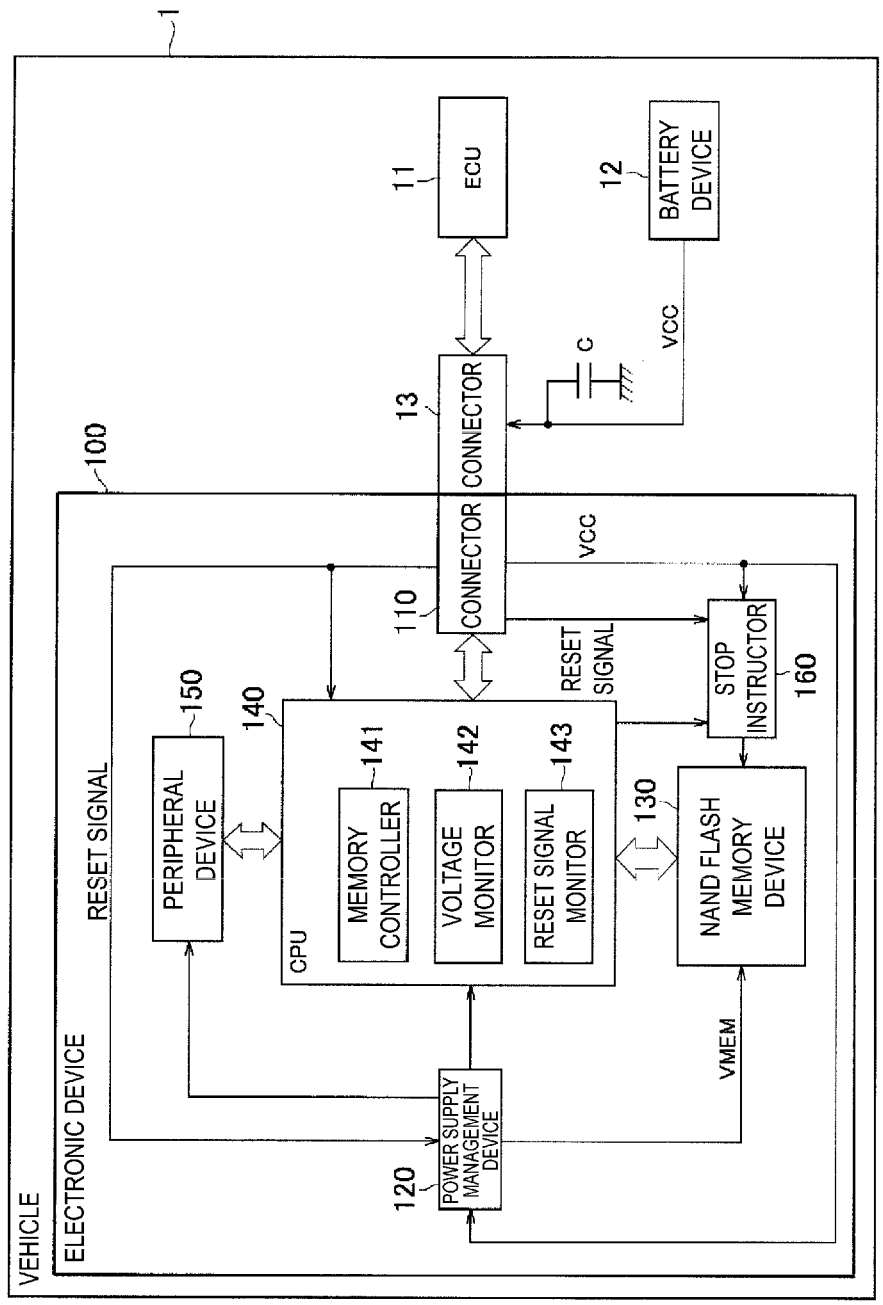
FIG. 1 is a diagram illustrating a configuration of an electronic device according to an embodiment.

FIG. 1 is a diagram illustrating a configuration of an electronic device 100 according to an embodiment.

As illustrated in FIG. 1, the electronic device 100 includes a connector 110, a power supply management device 120, a NAND flash memory device 130, a central processing unit (CPU) 140, a peripheral device 150, and a stop instructor 160.

The connector 110 is an interface that electrically connects to a vehicle 1. The connector 110 has a plurality of terminals. In an embodiment, the main power of the electronic device 100 is supplied from the vehicle 1 side via the connector 110. Specifically, the main power is supplied from a battery device 12 of the vehicle 1 via a connector 13 on the vehicle 1 side and the connector 110 on the electronic device 100 side. Various commands, data, reset signals, and the like are input from an electronic controller (ECU) 11 on the vehicle 1 side via the connector 13 and the connector 110.

The power supply management device 120 receives the voltage of the main power supplied from the vehicle 1 side (hereinafter referred to as the "main power supply voltage VCC") and generates a power supply voltage to be supplied to each unit in the electronic device 100. The power supply management device 120 generates a power supply voltage of the NAND flash memory device 130 (hereinafter referred to as the "memory power supply voltage VMEM") from the main power supply voltage VCC. The memory power supply voltage VMEM is assumed to be a lower voltage than the main power supply voltage VCC.

When the reset signal is input from the vehicle 1 side, the power supply management device 120 initializes (resets) the state by stopping the supply of power to each unit in the electronic device 100. In an embodiment, the power supply management device 120 causes the memory power supply voltage VMEM to drop (that is, stops supplying the memory power supply voltage VMEM) when the main power supply voltage VCC falls below a first threshold Th1.

The NAND flash memory device 130 is an example of a non-volatile memory device. The NAND flash memory device 130 is composed of a memory cell array, a bit line control circuit, a column decoder, a data input/output buffer, a word line control circuit, and the like. The NAND flash memory device 130 is controlled by various command control signals input from the CPU 140, such as an address latch enable (ALE), a command latch enable (CLE), a wright enable (WE), and/or a read enable (RE), for example.

The CPU 140 is an example of a processor. The CPU 140 issues commands for "read", "write", and/or "erase", and the like of data to the NAND flash memory device 130 in response to data and commands from the ECU 11 for example, to control the NAND flash memory device 130.

In an embodiment, the CPU 140 executes programs stored in a ROM included in the peripheral device 150 or the NAND flash memory device 130, thereby performing the functions of a memory controller 141, a voltage monitor 142, and a reset signal monitor 143.

The memory controller 141 issues commands to the NAND flash memory device 130. The commands include a write command, a read command, and an erase command.

The voltage monitor 142 monitors the voltage of the power supply and detects a voltage drop. Specifically, the voltage monitor 142 monitors the main power supply voltage VCC to detect a drop in the main power supply voltage VCC. In an embodiment, the voltage monitor 142 detects a drop in the main power supply voltage VCC when the main power supply voltage VCC falls below a second threshold Th2. The second threshold Th2 is larger than the first threshold Th1 described above.

The voltage monitor 142 indirectly obtains the voltage of the main power supply voltage VCC through the power supply management device 120. Alternatively, the voltage monitor 142 may directly acquire the voltage of the main power supply voltage VCC from a main power supply terminal MAIN_VCC (see FIG. 2) included in the connector 110.

The reset signal monitor 143 monitors the reset signal input from the vehicle 1 side. The reset signal monitor 143 detects the reset signal through the power supply management device 120. Alternatively, the reset signal monitor 143 may directly detect the reset signal from a reset signal terminal RESETX (see FIG. 2) included in the connector 110.

The memory controller 141 ceases issuing an erase command or a write command if a drop in the main power supply voltage VCC is detected by the voltage monitor 142 before the issue of the erase command or the write command to the NAND flash memory device 130. Specifically, the memory controller 141 ceases issuing an erase command or a write command if a drop in the main power supply voltage VCC is detected immediately before the issue of the erase command or the write command. Here, "immediately before the issue of the erase command or the write command" refers to a period of a predetermined time before the issue timing of the erase command or the write command.

The memory controller 141 ceases issuing an erase command or a write command if an input of the reset signal is detected by the reset signal monitor 143 before the issue of the erase command or the write command to the NAND flash memory device 130. Specifically, the memory controller 141 ceases issuing an erase command or a write command if an input of the reset signal is detected immediately before the issue of the erase command or the write command.

The peripheral device 150 includes a RAM and a ROM. When the electronic device 100 is an in-vehicle communication module, the peripheral device 150 includes an RF circuit for performing wireless communications.

The stop instructor 160 outputs a stop signal for stopping operation according to an erase command or a write command to the NAND flash memory device 130. A write protect (WP) signal can be used as such a stop signal.

In an embodiment, the stop instructor 160 outputs a write protect signal to the NAND flash memory device 130 if a drop in the main power supply voltage VCC is detected after the memory controller 141 issues an erase command or a write command.

The stop instructor 160 outputs a write protect signal to the NAND flash memory device 130 if an input of the reset signal is detected after the memory controller 141 issues an erase command or a write command.

In this way, the memory controller 141, the voltage monitor 142, and the reset signal monitor 143 perform software-based power discontinuity measures. In the following, an example is described in which hardware-based power discontinuity measures are performed in addition to the software-based power discontinuity measures, but the software-based power discontinuity measures and the hardware-based power discontinuity measures may be implemented separately from each other.

Figure 2:
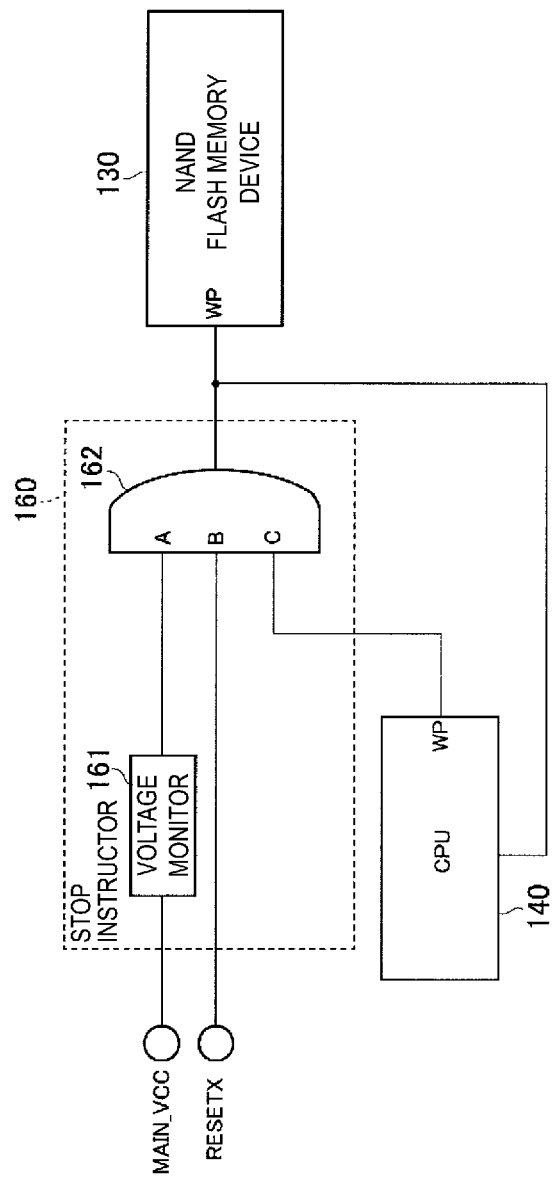
FIG. 2 is a diagram illustrating a configuration example of a stop instructor according to an embodiment.

FIG. 2 is a diagram illustrating a configuration example of the stop instructor 160 according to an embodiment. The stop instructor 160 is a circuit unit that performs hardware-based power discontinuity measures.

As illustrated in FIG. 2, the stop instructor 160 has a logic circuit 162 that outputs a write protect signal to the NAND flash memory device 130. The logic circuit 162 outputs a write protect signal to the NAND flash memory device 130 when either a signal indicating a drop in the main power supply voltage VCC or the reset signal is input when a signal indicating the issue of an erase command or a write command is input from the CPU 140.

In an embodiment, the stop instructor 160 has a voltage monitor 161 that monitors the voltage of the main power supply voltage VCC from the main power supply terminal MAIN_VCC included in the connector 110. In one embodiment, the voltage monitor 161 detects a drop in the main power supply voltage VCC when the main power supply voltage VCC falls below the second threshold Th2. Here, the second threshold Th2 is larger than the first threshold Th1 described above. The voltage monitor 161 typically outputs a signal at a high level "1", but outputs a signal at a low level "0" when a drop in the main power supply voltage VCC is detected.

The reset signal terminal RESETX is typically set to the high level "1" but is set to the low level "0" when a reset is requested by the vehicle 1 side. Inputting the reset signal means that the reset signal terminal RESETX is set to the low level "0".

Furthermore, the CPU 140 outputs a write protect signal WP of the high level "1" at the time from the issue of an erase command or a write command to the completion of the erasing or writing.

In an embodiment, the logic circuit 162 is an AND circuit having inputs A to C. The input A receives a signal from the voltage monitor 161. The input B receives a signal from the reset signal terminal RESETX. The input C receives a write protect signal WP from the CPU 140.

During the erasing or writing on the NAND flash memory device 130, all of the inputs A to C of the logic circuit 162 typically receive an input of a signal at the high level "1", and thus the output of the logic circuit 162 is also at the high level "1".

On the other hand, when the main power supply voltage VCC falls below the second threshold Th2, the voltage monitor 161 outputs a signal at the low level "0" to the input A. As a result, the output of the logic circuit 162 is switched to the low level "0" to forcibly cease the erase or write operation in the NAND flash memory device 130.

In a case where the reset signal is input, that is, the reset signal terminal RESETX is set to the low level "0", the output of the logic circuit 162 is switched to the low level "0", and the erase or write operation in the NAND flash memory device 130 is forcibly ceased.

Note that the CPU 140 monitors the output of the logic circuit 162 and performs a reset process when the output of the logic circuit 162 is switched to the low level "0". The "reset process" refers to a process for initializing the state of the CPU 140.

In this way, the stop instructor 160 performs hardware-based power discontinuity measures. As described above, the power discontinuity measures taken by the stop instructor 160 can be implemented separately from the software-based power discontinuity measures.

Operation of Electronic Device

Figure 3:
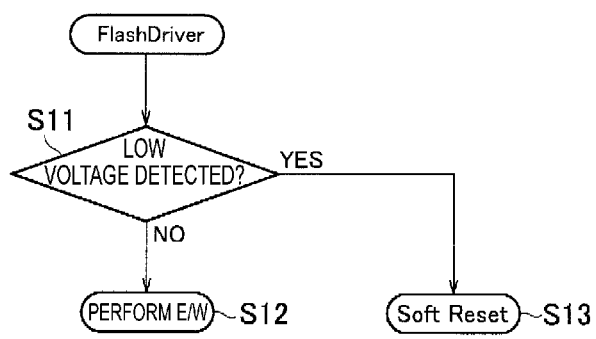
FIG. 3 is a diagram illustrating an operation example 1 of the electronic device according to an embodiment.

An operation of the electronic device 100 according to an embodiment will now be described. FIG. 3 is a diagram illustrating an operation example 1 of the electronic device 100 according to the embodiment.

As illustrated in FIG. 3, in step S11, the memory controller 141 (Flash Driver) checks whether the voltage monitor 142 has detected a drop in the main power supply voltage VCC immediately before erasing or writing (E/W) is performed on the NAND flash memory device 130.

When the voltage monitor 142 has not detected the drop in the main power supply voltage VCC (step S11: NO), in step S12, the memory controller 141 issues an erase or write (E/W) command to the NAND flash memory device 130.

On the other hand, when the voltage monitor 142 has detected the drop in the main power supply voltage VCC (step S11: YES), in step S13, the memory controller 141 performs initialization processing (Soft Reset) to cease the erasing or writing (E/W) on the NAND flash memory device 130.

Figure 4:
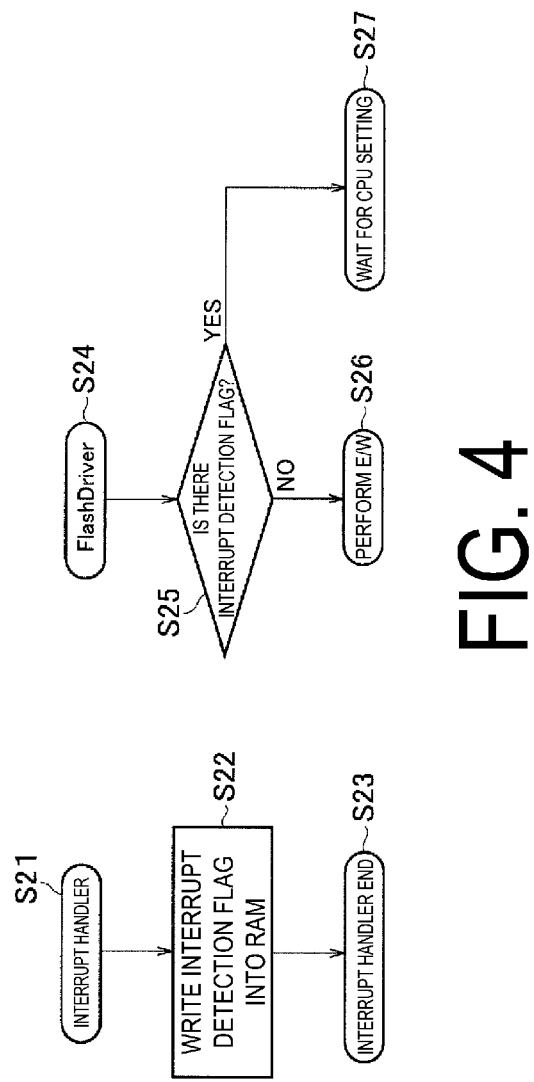
FIG. 4 is a diagram illustrating an operation example 2 of the electronic device according to an embodiment.

FIG. 4 is a diagram illustrating an operation example 2 of the electronic device 100 according to the embodiment.

As illustrated in FIG. 4, in step S21, the reset signal monitor 143 detects an input of the reset signal and causes interrupt processing.

In step S22, the reset signal monitor 143 writes an interrupt detection flag into the RAM through the interrupt processing.

In step S23, the reset signal monitor 143 terminates the interrupt processing when the interrupt detection flag is written into the RAM.

In step S24, the memory controller 141 (Flash Driver) starts an operation after the interrupt processing.

In step S25, the memory controller 141 checks whether the interrupt detection flag is in the RAM immediately before the erasing or writing (E/W) is performed on the NAND flash memory device 130.

When the interrupt detection flag is not in the RAM (step S25: NO), in step S26, the memory controller 141 issues an erase or write (E/W) command to the NAND flash memory device 130.

On the other hand, when the interrupt detection flag is in the RAM (step S25: YES), in step S27, the memory controller 141 ceases the erasing or writing (E/W) on the NAND flash memory device 130 and waits for CPU reset by the power supply management device 120.

FIG. 5 is a diagram illustrating an example of operation waveforms in the electronic device 100 according to an embodiment.

As illustrated in FIG. 5, at a time point t1, the memory controller 141 issues an erase command or a write command to the NAND flash memory device 130. The NAND flash memory device 130 starts the erase or write operation and outputs a signal (BUSY), to the CPU 140, indicating that the erase or write operation is being performed. Specifically, if the signal (BUSY) is at the low level "0", it means that the NAND flash memory device 130 performing the operation.

When the input of the voltage drop or the reset signal of the main power supply voltage VCC is detected before the time point t1, the issue of the erase command or the write command is ceased as a result of the operation in FIG. 3 or FIG. 4.

At a time point t2, the power supply is interrupted for some reason, and the main power supply voltage VCC starts to drop. While FIG. 5 illustrates an example in which the main power supply voltage VCC sharply drops, the main power supply voltage VCC actually drops more gradually than what is illustrated in FIG. 5 because a capacitor C (see FIG. 1) is connected to a main power supply (MAIN power supply) for suppressing the power supply variation.

At a time point t3, the main power supply voltage VCC falls below the second threshold Th2, and thus the voltage monitors 142 and 161 detect the drop in the main power supply voltage VCC. When the erase command or the write command is issued after the time point t1 and until the time point t3, the stop instructor 160 forcibly ceases the erase or write operation, by outputting the write protect signal WP to the NAND flash memory device 130.

At a time point t4, the main power supply voltage VCC falls below the first threshold Th1, and thus the power supply management device 120 stops supplying the memory power supply voltage VMEM (NAND power supply).

Summary of the Embodiments

In the electronic device 100 according to an embodiment, the memory controller 141 ceases issuing an erase command or a write command to the NAND flash memory device 130 if a power supply voltage drop is detected before the erase command or the write command is issued. Thus, data can be prevented from being lost due to the power supply voltage dropping during the writing or erasing of data in the NAND flash memory device 130. Furthermore, an increase in product cost can be avoided because no internal battery is required for backup.

In an embodiment, the voltage monitors 142 and 161 monitor the main power supply voltage VCC instead of the memory power supply voltage VMEM, to detect the drop in the main power supply voltage VCC. As a result, a sign of the drop in the memory power supply voltage VMEM can be detected before the memory power supply voltage VMEM drops, whereby power discontinuity measures can be initiated at an earlier stage.

Specifically, the power supply management device 120 makes the memory power supply voltage VMEM drop when the main power supply voltage VCC falls below the first threshold Th1. The voltage monitors 142 and 161 detect a drop in the main power supply voltage VCC when the main power supply voltage VCC falls below the second threshold Th2. Here, the second threshold is larger than the first threshold. As a result, a sign of the drop in the memory power supply voltage VMEM can be detected before the power supply management device 120 makes the memory power supply voltage VMEM drop, and thus power discontinuity measures can be initiated at an earlier stage.

In an embodiment, the memory controller 141 ceases issuing an erase command or a write command to the NAND flash memory device 130 if an input of the reset signal is detected before the erase command or the write command is issued. This makes it possible to prevent the loss of stored data due to the drop in the memory power supply voltage VMEM caused by the reset signal.

In an embodiment, the stop instructor 160 outputs a write protect signal to the NAND flash memory device 130 if a drop in the main power supply voltage VCC is detected after an erase command or a write command is issued. Thus, even after an erase command or a write command is issued, a loss of stored data due to a drop in the main power supply voltage VCC may be prevented by stopping the operation according to this command.

In an embodiment, the stop instructor 160 outputs a write protect signal to the NAND flash memory device 130 if an input of the reset signal is detected after an erase command or a write command is issued. Thus, even after an erase command or a write command is issued, a loss of stored data due to the reset signal may be prevented by stopping the operation according to this command.

In an embodiment, the stop instructor 160 has the logic circuit 162 that outputs a write protect signal to the NAND flash memory device 130. The logic circuit 162 outputs a write protect signal to the NAND flash memory device 130 in a case where either a signal indicating a drop in the main power supply voltage VCC or the reset signal is input when a signal indicating the issue of an erase command or a write command is input. With the stop instructor 160 thus configured with hardware to enable faster operations than in a case of software control, the loss of stored data can be more easily prevented.

Other Embodiments

Although in the above-described embodiment, an example in which the stop instructor 160 is configured by hardware is described, the stop instructor 160 may be executed by software so that the CPU 140 is provided with the function of the stop instructor 160.

Although in the embodiment described above, an example is described in which the memory controller 141, the voltage monitor 142, and the reset signal monitor 143 are implemented by software, the memory controller 141, the voltage monitor 142, and the reset signal monitor 143 may be implemented by hardware.

A program causing a computer to execute each of the processes performed by the electronic device 100 may be provided. The program may be recorded in a computer readable medium. Use of the computer readable medium enables the program to be installed on a computer. Here, the computer readable medium on which the program is recorded may be a non-transitory recording medium. The non-transitory recording medium is not particularly limited, and may be, for example, a recording medium such as a CD-ROM, a DVD-ROM, or the like. Functional units (circuits) for performing the processes performed by the electronic device 100 may be integrated, to configure a semiconductor integrated circuit (chip set, SoC).

Embodiments have been described above in detail with reference to the drawings, but specific configurations are not limited to those described above, and various design modifications can be made without departing from the gist of the present disclosure.

The invention claimed is:

1. An electronic device comprising:
a non-volatile memory device;
a memory controller configured to issue a command for either erasing or writing of data to the non-volatile memory device;
a voltage monitor configured to monitor a voltage of a power supply to detect a voltage drop; and
a power supply management device configured to generate a power supply voltage of the non-volatile memory device based on a voltage of a main power supply, wherein
when the voltage drop is detected before an issue of the command, the memory controller ceases the issue of the command to the non-volatile memory device,
the voltage monitor monitors the voltage of the main power supply to detect a voltage drop of the main power supply,
the power supply management device causes the power supply voltage of the non-volatile memory device to drop, when a reset signal is input, and
when the input of the reset signal is detected before the issue of the command, the memory controller ceases the issue of the command to the non-volatile memory device.

2. The electronic device according to claim 1, further comprising
a stop instructor configured to output a stop signal for stopping an operation according to the command to the non-volatile memory device, wherein
when the voltage drop of the main power supply is detected after the issue of the command, the stop instructor outputs the stop signal to the non-volatile memory device.

3. The electronic device according to claim 2, wherein
when the input of the reset signal is detected after the issue of the command, the stop instructor outputs the stop signal to the non-volatile memory device.

4. The electronic device according to claim 3, wherein
the stop instructor includes a logic circuit configured to output the stop signal to the non-volatile memory device, and
when either of a signal indicating the voltage drop of the main power supply or the reset signal is input while a signal indicating the issue of the command is being input, the logic circuit outputs the stop signal to the non-volatile memory device.

5. The electronic device according to claim 1, wherein
the power supply management device causes the power supply voltage of the non-volatile memory device to drop when the voltage of the main power supply falls below a first threshold,
the voltage monitor detects the voltage drop of the main power supply when the voltage of the main power supply falls below a second threshold, and
the second threshold is greater than the first threshold.

6. The electronic device according to claim 1, wherein the main power supply is a battery device of a vehicle.

7. A vehicle including the electronic device according to claim 1.

8. A method for controlling an electronic device including a non-volatile memory device, the method comprising:
monitoring a voltage of a power supply and detecting a voltage drop;
generating a power supply voltage of the non-volatile memory device based on a voltage of a main power supply;
when the voltage drop is detected before a command for either erasing or writing of data to the non-volatile memory device is issued, ceasing an issue of the command to the non-volatile memory device;
monitoring the voltage of the main power supply to detect a voltage drop of the main power supply;
causing the power supply voltage of the non-volatile memory device to drop, when a reset signal is input; and
when the input of the reset signal is detected before the command for either erasing or writing of data to the non-volatile memory device is issued, ceasing the issue of the command to the non-volatile memory device.

* * * * *